United States Patent
Ji et al.

(10) Patent No.: US 11,955,961 B2
(45) Date of Patent: Apr. 9, 2024

(54) SWITCH CIRCUIT FOR ULTRA-HIGH FREQUENCY BAND

(71) Applicant: Electronics and Telecommunications Research Institute, Daejeon (KR)

(72) Inventors: Hong Gu Ji, Daejeon (KR); Dong Min Kang, Daejeon (KR); Byoung-Gue Min, Daejeon (KR); Jongmin Lee, Daejeon (KR); Kyu Jun Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 17/879,047

(22) Filed: Aug. 2, 2022

(65) Prior Publication Data

US 2023/0115787 A1 Apr. 13, 2023

(30) Foreign Application Priority Data

Oct. 12, 2021 (KR) .................. 10-2021-0135169
Jan. 6, 2022 (KR) .................. 10-2022-0002203

(51) Int. Cl.
*H03K 3/00* (2006.01)
*H03K 17/687* (2006.01)
*H03K 17/693* (2006.01)

(52) U.S. Cl.
CPC ................... *H03K 17/687* (2013.01)

(58) Field of Classification Search
None
See application file for complete search history.

(56) References Cited

U.S. PATENT DOCUMENTS

| | | | | |
|---|---|---|---|---|
| 5,191,338 A | * | 3/1993 | Katz | H03G 3/3036 330/277 |
| 6,720,850 B2 | * | 4/2004 | Sasabata | H03K 17/687 333/261 |
| 9,450,639 B2 | * | 9/2016 | Zhang | H04B 1/006 |
| 9,479,160 B2 | * | 10/2016 | Srihari | H03K 17/687 |
| 9,667,255 B2 | * | 5/2017 | Englekirk | H03K 19/018585 |
| 10,700,682 B2 | * | 6/2020 | Saito | H03K 17/693 |
| 10,897,246 B2 | | 1/2021 | Scott et al. | |
| 10,992,334 B2 | * | 4/2021 | Ezz | H04B 1/48 |

(Continued)

FOREIGN PATENT DOCUMENTS

| KR | 10-2002-0082840 A | 10/2002 |
|---|---|---|
| KR | 10-2006-0049488 A | 5/2006 |
| KR | 10-2019-0053787 A | 5/2019 |

*Primary Examiner* — Kenneth B Wells
(74) *Attorney, Agent, or Firm* — NSIP Law

(57) ABSTRACT

Disclosed is a switch circuit for an ultra-high frequency band, which includes a transistor including a first terminal connected to an input stage, a second terminal connected to an output stage, and a gate terminal, an inductor connected to the transistor in parallel, between the input stage and the output stage, a variable gate driver to apply a gate input voltage to the gate terminal and, an input resistor connected between the variable gate driver and the gate terminal. The variable gate driver adjusts the gate input voltage to be in one of a first voltage level for turning on the transistor and a second voltage level for turning off the transistor. The second voltage level varies depending on a capacitance between the first terminal and the second terminal, when the transistor is in a turn-off state.

13 Claims, 9 Drawing Sheets

(56) References Cited

U.S. PATENT DOCUMENTS

| | | |
|---|---|---|
| 2004/0032706 A1 | 2/2004 | Kemmochi et al. |
| 2005/0270083 A1 | 12/2005 | Nakatsuka et al. |
| 2010/0244985 A1 | 9/2010 | Chang et al. |
| 2013/0277717 A1 | 10/2013 | Ji et al. |
| 2019/0296632 A1* | 9/2019 | Hirose .................... H02M 1/32 |

* cited by examiner

SWITCH CIRCUIT FOR ULTRA-HIGH FREQUENCY BAND

CROSS-REFERENCE TO RELATED APPLICATIONS

This application claims priority under 35 U.S.C. § 119 to Korean Patent Application Nos. 10-2021-0135169 and 10-2022-0002203 filed on Oct. 12, 2021 and Jan. 6, 2022, respectively, in the Korean Intellectual Property Office, the disclosures of which are incorporated by reference herein in their entireties.

BACKGROUND

Embodiments of the present disclosure described herein relate to a switch circuit for an ultra-high frequency band, and more particularly, relate to a switch circuit for an ultra-high frequency band, capable of adjusting a frequency response.

A transistor switch may include a gate terminal, a first terminal, and a second terminal. When a turn-on voltage is applied to the gate terminal of the transistor switch, a channel is formed between the first terminal and the second terminal, and the first terminal and the second terminal are electrically connected to each other. When a turn-off voltage is applied to the gate terminal of the transistor switch, the channel is not formed between the first terminal and the second terminal, and the first terminal and the second terminal are electrically disconnected from each other. The transistor switch is used as an essential component of an electronic device, based on the switching characteristic.

When the first terminal and the second terminal of the transistor switch are electrically disconnected from each other, a capacitance may be present between the first terminal and the second terminal. Even if the capacitance is present, when a signal having a low frequency band is applied between the first terminal and the second terminal, the transistor switch may electrically connect the first terminal and the second terminal to each other or disconnect the first terminal and the second terminal from each other. However, when a signal having an ultra-high frequency band is applied between the first terminal and the second terminal, the capacitance between the first terminal and the second terminal may pass the signal having the ultra-high frequency band. In other words, in an electronic device using a signal having the ultra-high frequency band, it may be difficult for the transistor switch to disconnect the first terminal and the second terminal from each other.

SUMMARY

Embodiments of the present disclosure provide a switch for an ultra-high frequency band, capable of electrically connecting and disconnecting a signal having the ultra-high frequency band.

According to an embodiment, a switch circuit for an ultra-high frequency band includes a transistor including a first terminal connected to an input stage, a second terminal connected to an output stage, and a gate terminal, an inductor connected to the transistor in parallel, between the input stage and the output stage, a variable gate driver to apply a gate input voltage to the gate terminal and, an input resistor connected between the variable gate driver and the gate terminal. The variable gate driver adjusts the gate input voltage to be in one of a first voltage level for turning on the transistor and a second voltage level for turning off the transistor, and the second voltage level varies depending on a capacitance between the first terminal and the second terminal, when the transistor is in a turn-off state.

According to an embodiment, the transistor includes at least two field effect transistors connected to each other in series between the input stage and the output stage, and the at least two field effect transistors include at least one of an n-channel type MOSFET, a p-channel type MOSFET, or a high electron mobility transistor (HEMT).

According to an embodiment, the input resistor includes at least two resistors connected between gate terminals of the at least two field effect transistors and the variable gate driver.

According to an embodiment, each of the at least two field effect transistors become in one of a turn-on state or the turn-off state, depending on gate input voltages applied to each of gate terminals of the at least two field effect transistors.

According to an embodiment, the variable gate driver adjusts the gate input voltage such that a center frequency of a resonance circuit formed by the transistor and the inductor connected to the transistor in parallel corresponds to a frequency of an input signal applied through the input stage.

According to an embodiment, the variable gate driver decreases the second voltage level, when a value of the capacitance decreases.

According to an embodiment, the variable gate driver increases the second voltage level, when the value of the capacitance increases.

According to an embodiment, a switch circuit includes a transistor including a first terminal connected to an input stage, a second terminal, and a gate terminal, an inductor connected to the transistor in parallel, between the input stage and an output stage, a variable gate driver to apply a gate input voltage to the gate terminal, an input resistor connected between the variable gate driver and the gate terminal, a coupler connected between the output stage and the transistor to extract a portion, which is transmitted to the output stage, of an RF signal applied to the input stage, and a diode connected between the coupler and the variable gate driver to convert the extracted RF signal to be in a direct current (DC) level and to output the conversion result to the variable gate driver. The variable gate driver adjusts the gate input voltage to be in one of a first voltage level for turning on the transistor and a second voltage level for turning off the transistor. The variable gate driver adjusts the gate input voltage based on the output DC level, when the transistor is in a turn-off state.

According to an embodiment, the transistor includes at least two field effect transistors connected to each other in series between the input stage and the output stage, and the at least two field effect transistors include at least one of an n-channel type MOSFET, a p-channel type MOSFET, or a HEMT.

According to an embodiment, the input resistor includes at least two resistors connected between gate terminals of the at least two field effect transistors and the variable gate driver.

According to an embodiment, each of the at least two field effect transistors become in one of a turn-on state or the turn-off state, depending on gate input voltages applied to each of gate terminals of the at least two field effect transistors.

According to an embodiment, the variable gate driver decreases or increases the second voltage level by an increment of a coupling voltage output from the coupler, when the coupling voltage output from the coupler is increased.

According to an embodiment, the variable gate driver adjusts the gate input voltage such that a center frequency of a resonance circuit formed by the transistor and the inductor connected to the transistor in parallel corresponds to a frequency of an input signal applied through the input stage.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, embodiments of the present disclosure will be described definitely and in detail, to the extent that those skilled in the art are able to easily replicate the present disclosure.

A transistor, which is one component of a switch circuit for an ultra-high frequency band, may be at least two field effect transistors, and the at least two field effect transistors may include one of an n-channel type MOSFET, a p-channel type MOSFET, or a HEMT. Hereinafter, although the transistor is described as a field effect transistor (FET), the technical spirit of the present disclosure is not limited to an FET.

Figure 1:
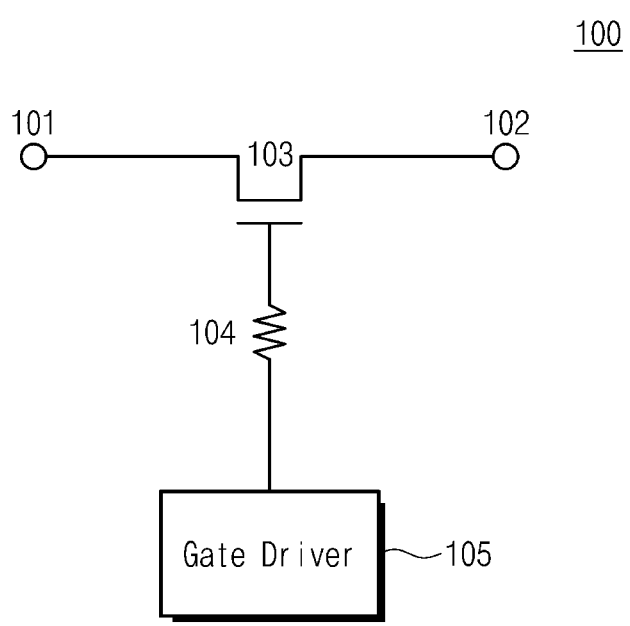
FIG. 1 is a view illustrating an FET switch circuit, according to a first embodiment.

FIG. 1 is a view illustrating an FET switch circuit 100 according to a first embodiment. Referring to FIG. 1, the FET switch circuit 100 according to the first embodiment may include a transistor 103 including a first terminal connected to an input stage 101, a second terminal connected to an output stage 102, and a gate terminal, an input resistor 104 connected to the gate terminal of the transistor 103, and a gate driver 105 connected to another end of the input resistor 104.

Each of the first terminal connected to the input stage 101 and the second terminal connected to the output stage 102 may operate as a drain terminal (or a source terminal) and a source terminal (or a drain terminal), respectively, depending on a voltage bias. When the transistor 103 is an n-channel type FET, the first terminal may correspond to the drain terminal and the second terminal may correspond to the source terminal. When the transistor 103 is a p-type FET, the first terminal may correspond to the source terminal and the second terminal may correspond to the drain terminal.

The input resistor 104 may increase an impedance viewed from the input stage 101 and the output stage 102 by increasing the impedance at the side of the gate terminal. The gate driver 105 may adjust a gate input voltage to be in one of a first voltage level for turning on the transistor 103 and a second voltage level for turning off the transistor 103.

Figure 2:
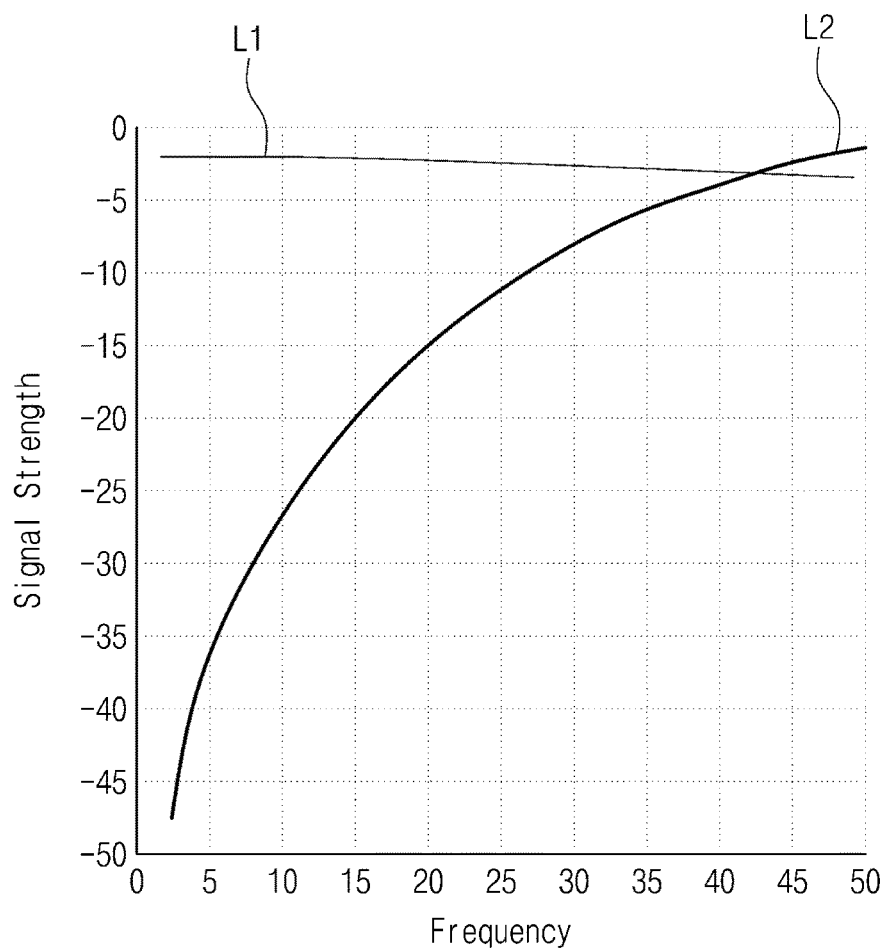
FIG. 2 is a view illustrating a frequency response when an FET switch circuit of FIG. 1 is in a turn-on and turn-off state.

FIG. 2 is a view illustrating a frequency response when the FET switch circuit 100 of FIG. 1 is in a turn-on and turn-off state. As illustrated in FIG. 2, a horizontal axis may represent a frequency, and the unit of the frequency may be GHz, and a vertical axis may represent signal strength, and the unit of the signal strength may be dB.

Referring to FIGS. 1 and 2, a first line L1 indicates the strength of a signal sensed by the output stage 102, when the transistor 103 is in the turn-on state, and when the signal is input to the input stage 101. A second line L2 indicates the strength of the signal sensed by the output stage 102, when the transistor 103 is in a turn-off state and the signal is input to the input stage 101.

As indicated by the first line L1, when the transistor 103 is in the turn-on state, the FET switch circuit 100 may transmit the signal of the input stage 101 to the output stage 102 in the entire frequency band. As indicated by the second line L2, when the transistor 103 is in the turn-off state, the FET switch circuit 100 may have a higher isolation characteristic in a low frequency band, but may have a lower isolation characteristic as a frequency band increases.

Figure 3:
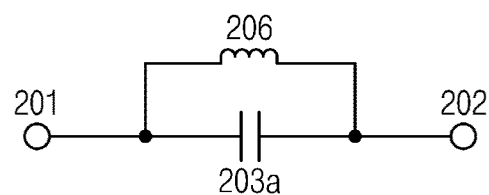
FIG. 3 is a view illustrating an FET switch circuit, according to a second embodiment.

FIG. 3 is a view illustrating an FET switch circuit 200, according to a second embodiment. Referring to FIG. 3, a capacitor 203a may be formed by modeling an internal capacitance, when a transistor (see reference numeral 103) is turned off.

An inductor 206 connected to the capacitor 203a (e.g., the turned-off transistor) in parallel may form an LC resonance circuit together with the internal capacitance of the capacitor 203a. In FIG. 2, although the inductor 206 is connected to one capacitor 203a in parallel, at least two transistors or at least two inductors connected in series may be connected between the input stage 201 and the output stage 202.

Figure 4:
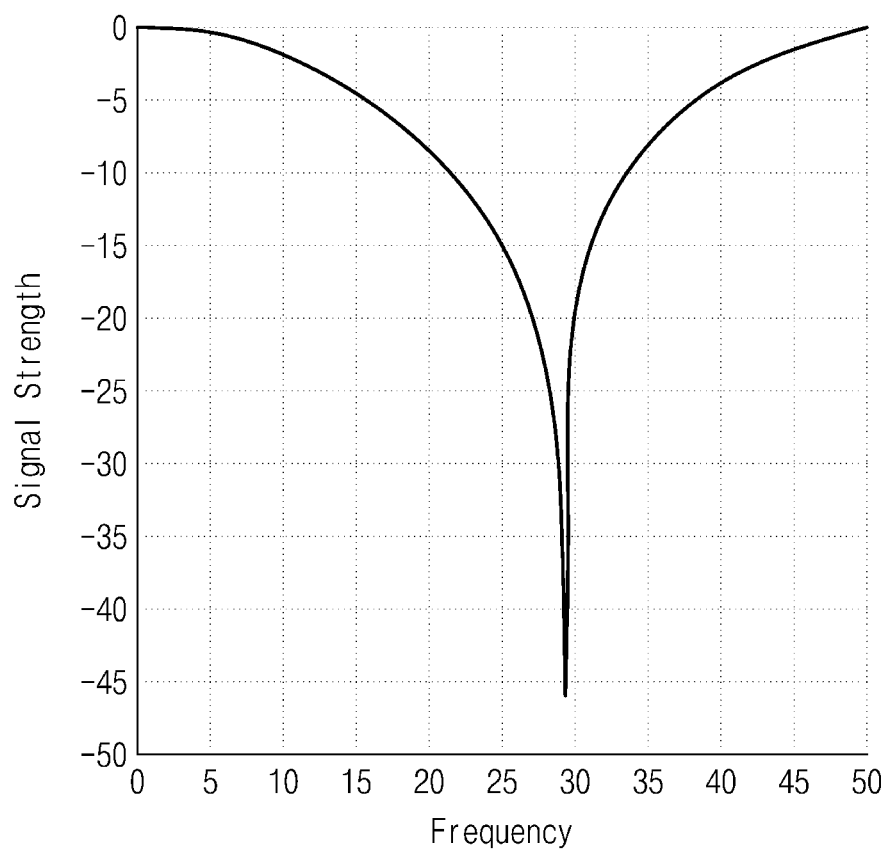
FIG. 4 is a view illustrating a frequency response of an FET switch circuit of FIG. 3.

FIG. 4 is a view illustrating a frequency response of the FET switch circuit 200 of FIG. 3. In FIG. 4, a horizontal axis represents a frequency, and the unit of the frequency may be GHz, and a vertical axis may represent signal strength, and the unit of the signal strength may be dB.

Referring to FIGS. 3 and 4, the FET switch circuit 200 may operate as a band stop filter. For example, the FET switch circuit 200 may be a band stop filter having a center frequency of about 30 GHz. When the band stop center frequency of the FET switch circuit 200 is matched with a frequency band of a signal used in the FET switch circuit 200, the FET switch circuit 200 may have higher isolation characteristics.

However, the capacitance of the internal capacitor 203a may vary due to errors caused in the manufacturing process of the transistor, or the change in an environment factor, such as a temperature and a voltage. Accordingly, the band stop center frequency of the FET switch circuit 200 may vary depending on a process, a temperature, or a voltage, and an isolation characteristic of the FET switch circuit 200 may also vary depending on the process, the temperature, or the voltage.

Figure 5:
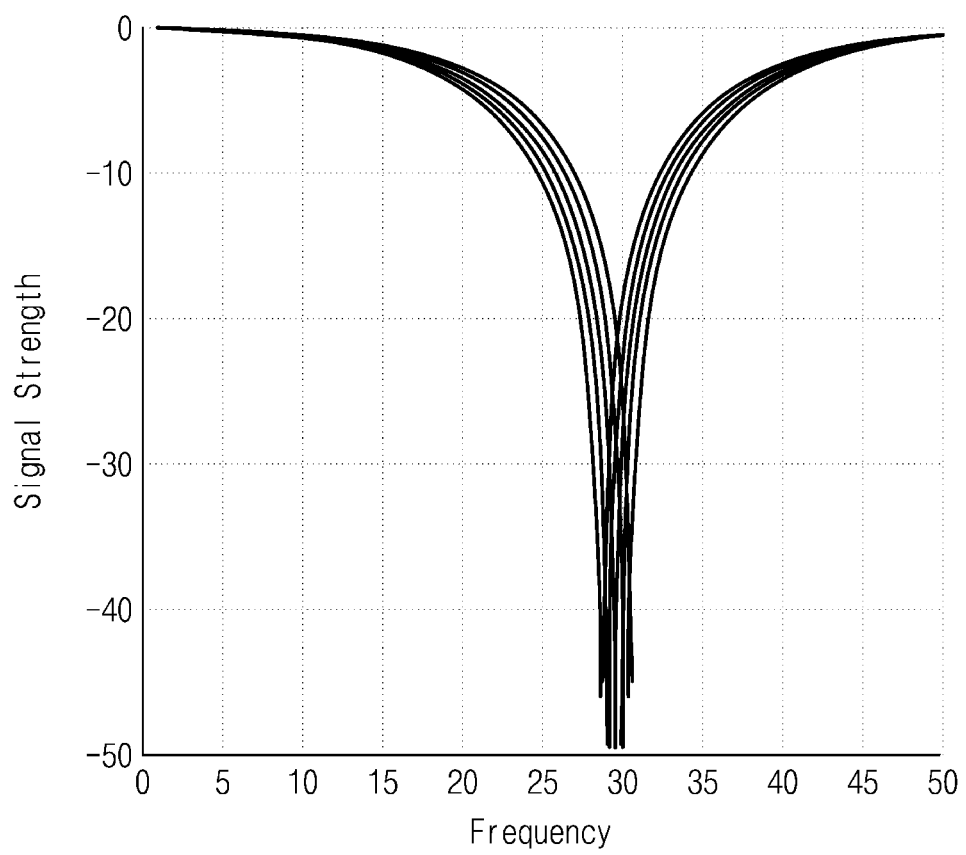
FIG. 5 is a view illustrating an example in which a frequency response of an FET switch circuit of FIG. 2 varies.

FIG. 5 is a view illustrating an example in which a frequency response of the FET switch circuit 200 of FIG. 2 varies. In FIG. 5, a horizontal axis may represent a frequency, and the unit of the frequency may be GHz, and a vertical axis may represent signal strength, and the unit of the signal strength may be dB. As illustrated in FIG. 5, the frequency response of the FET switch circuit 200 may vary in a range of 2 GHz or more.

Figure 6:
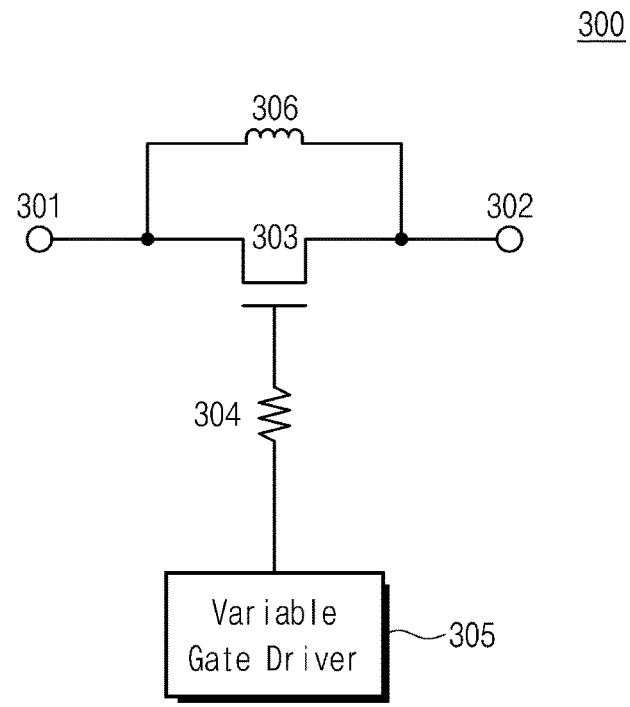
FIG. 6 is a view illustrating an FET switch circuit, according to a third embodiment of the present disclosure.

FIG. 6 is a view illustrating an FET switch circuit 300 according to a third embodiment of the present disclosure. Referring to FIG. 6, the FET switch circuit 300 may include a transistor 303 including a first terminal connected to an input stage 301, a second terminal connected to an output stage 302, and a gate terminal, an input resistor 304 connected to the gate terminal of the transistor 304, a variable gate driver 305 connected to another end of the input resistor 304, and an inductor 306 connected to the transistor 303 in parallel, between the input stage 301 and the output stage 302.

The variable gate driver 305 may adjust a gate input voltage to be in one of a first voltage level for turning on the transistor 303 and a second voltage level for turning off the transistor 303 is turned off. The variable gate driver 305 may change the second voltage level for turning off the transistor 303 depending on an internal capacitance between a drain terminal and a source terminal of the transistor 303.

When the second voltage level increases, the internal capacitance of the transistor 303 may decrease. When the second voltage level decreases, the internal capacitance of the transistor 303 may increase. In other words, the internal capacitance of the transistor 303 may be adjusted by adjusting the second voltage level using the variable gate driver 305.

Figure 7:
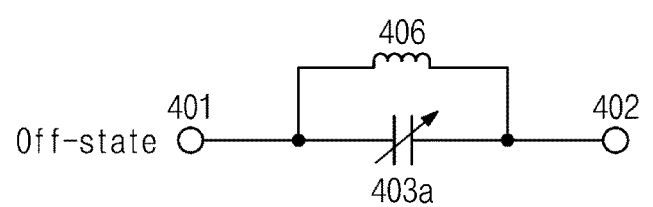
FIG. 7 illustrates an example of an FET switch circuit when a transistor is turned off.

FIG. 7 illustrates an example of an FET switch circuit 400 when the transistor 303 is turned off. Referring to FIG. 7, the transistor 303, which is turned off, may be modeled as a capacitor 403a between the input stage 401 and the output stage 402. The capacitor 403a may operate as an LC resonance circuit, for example, a band pass filter, together with the inductor 406.

The variable gate driver 305 may change an internal capacitance of the transistor 303, depending on the second voltage level supplied to the gate of the transistor 303. Accordingly, the transistor 303, which is turned off, may be modeled as the variable capacitor 403a.

The variable gate driver 305 may adjust the second voltage level such that the frequency of the input signal applied through the input stage 301 or 401 is matched with the band stop center frequency of the FET switch circuit 400.

Although FIG. 7 illustrates a configuration in which the inductor 406 is connected to one transistor 303 in parallel, the present disclosure is not limited thereto. For example, at least two transistors or at least two inductors may be connected between the input stage 401 and the output stage 402.

Figure 8:
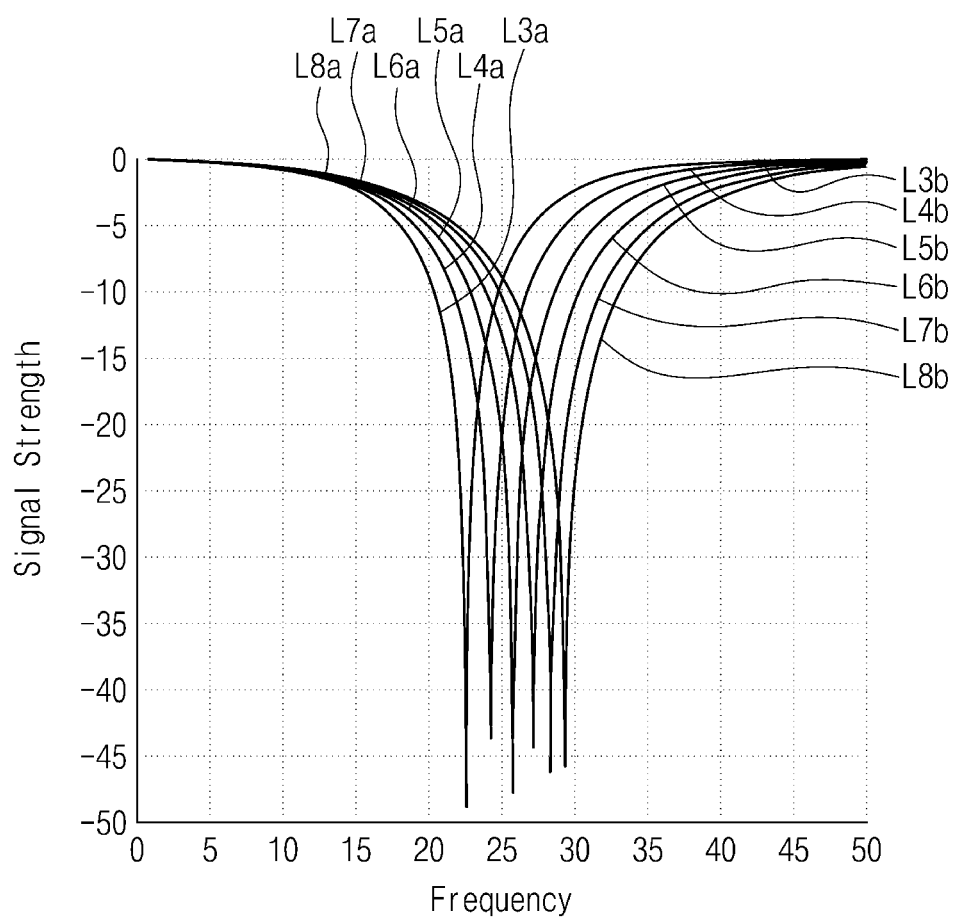
FIG. 8 is a view illustrating a frequency response range of an FET switch circuit of FIG. 7.

FIG. 8 is a view illustrating a frequency response range of the FET switch circuit 400 of FIG. 7. In FIG. 8, a horizontal axis may represent a frequency, and the unit of the frequency may be GHz, and a vertical axis represents signal strength, and the unit of the signal strength may be dB.

Referring to FIGS. 6, 7, and 8, the band stop center frequency of the FET switch circuit 400 may vary depending on the second voltage level provided to the transistor 303 by the variable gate driver 305. Third lines L3a and L3b of FIG. 8 may correspond to frequency responses, when the second voltage level is −30V. Fourth lines L4a and L4b may correspond to frequency responses, when the second voltage level is −25 V.

Fifth lines L5a and L5b may correspond to frequency responses when the second voltage level is −20 V. Sixth lines L6a and L6b may correspond to frequency responses when the second voltage level is −15 V. Seventh lines L7a and L7b may correspond to frequency responses when the second voltage level is −10 V. Eighth lines L8a and L8b may correspond to frequency responses, when the second voltage level is −5 V.

Although FIG. 8 illustrates that the frequency response varies in the range of about 7 GHz, when the second voltage level is adjusted from 30V to −5V at intervals of −5V, the range of change in the frequency response is not limited.

Figure 9:
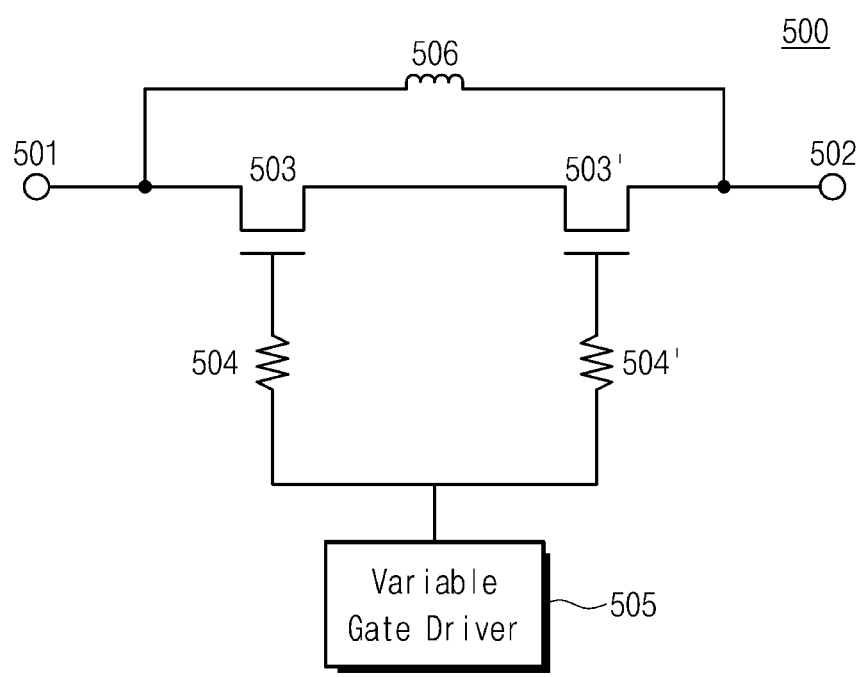
FIG. 9 is a view illustrating an FET switch circuit, according to a fourth embodiment.

FIG. 9 is a view illustrating an FET switch circuit 500, according to a fourth embodiment. Referring to FIG. 9, the FET switch circuit 500 may include transistors 503 and 503' including a first terminal connected to an input stage 501, a second terminal connected to an output stage 502, and gate terminals, input resistors 504 and 504' connected to the gate terminals of the transistors 503 and 503', a variable gate driver 505 connected to another end of the input resistor 504 and another end of the input resistor 504' in common, and an inductor 506 connected to the transistors 503 and 503' in parallel, between the input stage 501 and the output stage 502.

At least two field effect transistors 503 and 503' may be turned on or off depending on gate input voltages applied to the relevant gate terminals, respectively. As described with reference to FIG. 7, at least two transistors 503 and 503' form an LC resonance circuit together with an inductor and may operate as a band stop filter.

Although two transistors 503 and 503' and two input resistors 504 and 504' are illustrated in FIG. 9, the present disclosure is not limited thereto. For example, at least three transistors and at least three input resistors may be provided in the two input resistors 504 and 504'. In this case, gate input voltages may be applied to gate terminals of at least three transistors through the variable gate driver 505.

Figure 10:
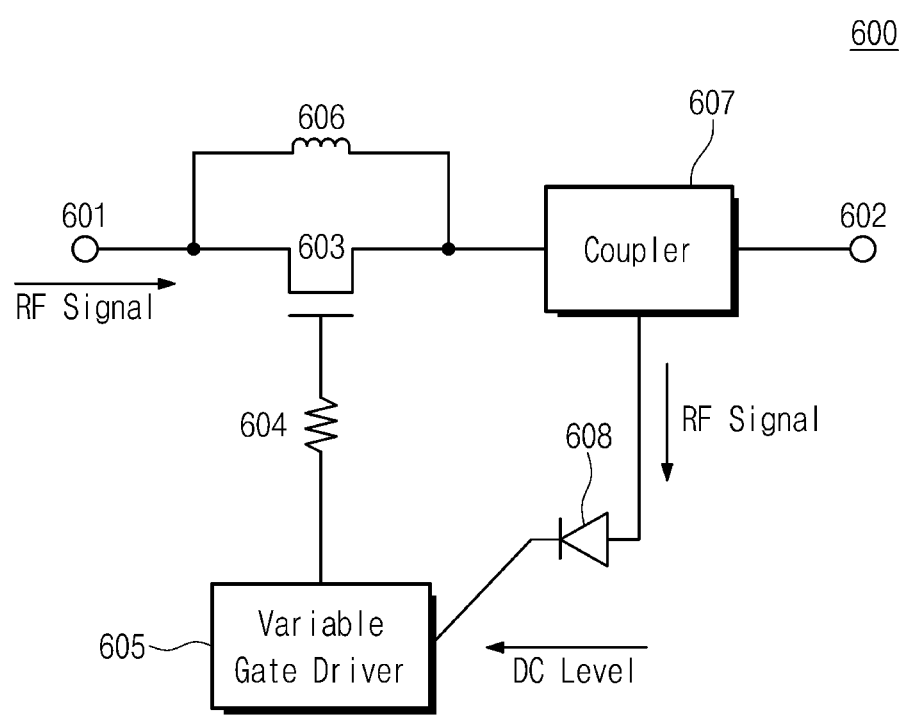
FIG. 10 is a view illustrating an FET switch circuit, according to a fifth embodiment.

FIG. 10 is a view illustrating an FET switch circuit 600 according to a fifth embodiment. Referring to FIG. 10, the FET switch circuit 600 may include a transistor 603 connected between a first terminal connected to an input stage 601, a second terminal connected to an output stage 602, and a gate terminal, an input resistor 604 connected to the gate terminal of the transistor 603, a variable gate driver 605 connected to another end of the input resistor 604, an inductor 606 connected to the transistor 603 in parallel, between the input stage 601 and the output stage 602, a coupler 607 connected between the transistor 603 and the output stage 602, and a diode 608 connected between the coupler 607 and the variable gate driver 605.

An amount of current, which is coupled and flows from the first terminal to the second terminal, may vary depending on the value of an internal capacitance (not illustrated) of the transistor 603. The coupler 607 may extract a portion of a radio frequency (RF) signal, which is output, from the RF signal applied to the input stage 601. The diode 608 may convert the extracted RF signal to be in a direct current (DC) level. The variable gate driver 605 may increase or decrease the gate input voltage based on the DC level converted by the diode 608.

The FET switch circuit 600 of FIG. 10 may detect a change in capacitance of the transistor 603 in real time. The FET switch circuit 600 may adjust the second voltage level provided to the gate terminal of the transistor 603 based on the detected capacitance in real time. Accordingly, the band stop center frequency of the FET switch circuit 600 may be adjusted in real time to correspond to the frequency of the RF signal.

Figure 11:
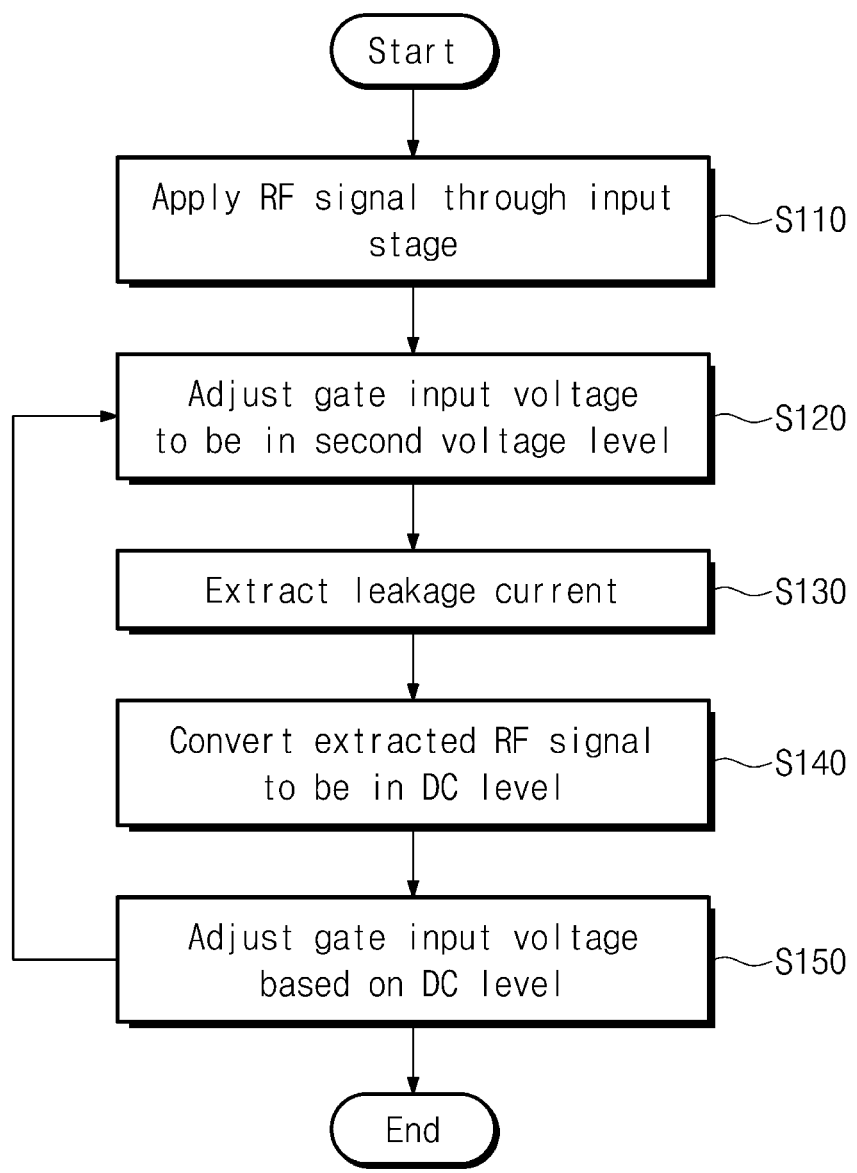
FIG. 11 is a flowchart illustrating a method for operating an FET switch circuit of FIG. 10.

FIG. 11 is a flowchart illustrating a method for operating an FET switch circuit of FIG. 10. Referring to FIGS. 10 and 11, in step S110, an RF signal may be applied to an input stage of the FET switch circuit 600. In this case, the RF signal may be transmitted through the first terminal connected to the input stage 601 and the second terminal connected to the output stage 602.

In step S120, the variable gate driver 605 may apply the gate input voltage to the gate terminal. In this case, the gate input voltage applied to the gate terminal may be adjusted to be in the second voltage level for turning off the transistor 603.

In step S130, the coupler 607 may extract a leakage current coupled and flowing from the first terminal to the second terminal due to the internal capacitance of the transistor 603.

In step S140, the diode 608 may convert the RF signal extracted by the coupler 607 into a signal in the DC level. The diode 608 may convert a signal, which is extracted from an RF signal transmitted through at least one transistor connected between the input stage 601 and the output stage 602, into a signal in a DC level.

In step S150, the variable gate driver 605 may adjust the second voltage level of the gate input voltage based on the DC level output from the diode 608.

According to an embodiment of the present disclosure, the switch circuit for the ultra-high frequency band is provided to electrically connect and disconnect the signal having the ultra-high frequency band.

The above description refers to embodiments for implementing the present disclosure. Embodiments in which a design is changed simply or which are easily changed may be included in the present disclosure as well as an embodiment described above. In addition, technologies that are easily changed and implemented by using the above embodiments may be included in the present disclosure. Accordingly, the scope of the present disclosure is not limited to the above-described embodiments, but defined by following claims and equivalents thereof.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A switch circuit comprising:
at least one transistor including a first terminal connected to an input stage, a second terminal, and a gate terminal;
an inductor connected to the at least one transistor in parallel, between the input stage and an output stage;
a variable gate driver configured to apply a gate input voltage to the gate terminal;
at least one input resistor connected between the variable gate driver and the gate terminal;
a coupler connected between the output stage and the at least one transistor to extract a portion, which is transmitted to the output stage, of an RF signal applied to the input stage; and
a diode connected between the coupler and the variable gate driver to convert the extracted RF signal to be in a direct current (DC) level and to output the conversion result to the variable gate driver,
wherein the variable gate driver adjusts the gate input voltage to be in one of a first voltage level for turning on the at least one transistor and a second voltage level for turning off the at least one transistor, and
wherein the variable gate driver adjusts the gate input voltage based on the output DC level, when the at least one transistor is in a turn-off state.

2. The switch circuit of claim 1, wherein the at least one transistor includes at least two field effect transistors connected to each other in series between the input stage and the output stage, and
wherein the at least two field effect transistors include at least one of an n-channel type MOSFET, a p-channel type MOSFET, or a HEMT.

3. The switch circuit of claim 2, wherein the at least one input resistor includes at least two resistors connected between gate terminals of the at least two field effect transistors and the variable gate driver.

4. The switch circuit of claim 2, wherein each of the at least two field effect transistors become in one of a turn-on state or the turn-off state, depending on gate input voltages applied to each of gate terminals of the at least two field effect transistors.

5. The switch circuit of claim 1, wherein the variable gate driver decreases or increases the second voltage level by an increment of a coupling voltage output from the coupler, when the coupling voltage output from the coupler is increased.

6. The switch circuit of claim 1, wherein the variable gate driver adjusts the gate input voltage such that a center frequency of a resonance circuit formed by the at least one transistor and the inductor connected to the at least one transistor in parallel corresponds to a frequency of an input signal applied through the input stage.

7. A method of operating a switch circuit for ultra-high frequency band, the method comprising:
applying an RF signal to an input stage of the switch circuit;
wherein the RF signal may be transmitted through a first terminal connected to the input stage and a second terminal connected to an output stage,
applying, by a variable gate driver, a gate input voltage to a gate terminal;
wherein the gate input voltage is adjusted to be in a second voltage level for turning off at least one transistor,
extracting, by a coupler, a portion of a leakage current of the RF signal flowing from the first terminal to the second terminal;
converting, by a diode, the portion of the leakage current extracted by the coupler into a signal in a DC level; and
adjusting, by the variable gate driver, the second voltage level of the gate input voltage based on the DC level output from the diode.

8. The method of claim 7, wherein the switch circuit includes:
an inductor connected to the at least one transistor in parallel, between the input stage and the output stage; and
at least one input resistor connected between the variable gate driver and the gate terminal;
wherein the diode is connected between the coupler and the variable gate driver, and
wherein the variable gate driver adjusts the gate input voltage to be in one of a first voltage level for turning on the at least one transistor and the second voltage level.

9. The method of claim 8, wherein the at least one transistor includes at least two field effect transistors connected to each other in series between the input stage and the output stage, and wherein the at least two field effect transistors include at least one of an n-channel type MOSFET, a p-channel type MOSFET, or a HEMT.

10. The method of claim 9, wherein the at least one input resistor includes at least two resistors connected between gate terminals of the at least two field effect transistors and the variable gate driver.

11. The method of claim 9, wherein each of the at least two field effect transistors operates in one of a turn-on state and a turn-off state, depending on gate input voltages applied to each of gate terminals of the at least two field effect transistors.

12. The method of claim 8, wherein the variable gate driver decreases or increases the second voltage level by an increment of a coupling voltage output from the coupler, when the coupling voltage output from the coupler is increased.

13. The method of claim 8, wherein the variable gate driver adjusts the gate input voltage such that a center frequency of a resonance circuit formed by the at least one transistor and the inductor connected to the at least one transistor in parallel corresponds to a frequency of an input signal applied through the input stage.

* * * * *